United States Patent [19]

Hirakawa et al.

[11] Patent Number: 5,017,548

[45] Date of Patent: May 21, 1991

[54] METHOD OF PRODUCING HIGH-TEMPERATURE SUPERCONDUCTING CERAMICS MATERIAL BY MECHANICAL ORIENTATION

[75] Inventors: Kazuyoshi Hirakawa; Hisao Kuriyaki, both of Fukuoka; Xu-guang Zheng, Kasuga, all of Japan

[73] Assignee: Kyushu University, Japan

[21] Appl. No.: 444,788

[22] Filed: Dec. 1, 1989

[30] Foreign Application Priority Data

Mar. 16, 1989 [JP] Japan .................................. 1-62297

[51] Int. Cl.$^5$ ............................................. H01L 39/12
[52] U.S. Cl. ....................................... 505/1; 505/725; 264/69
[58] Field of Search .......................... 505/1, 729, 725; 264/69; 432/134

[56] References Cited

PUBLICATIONS

Grader et al., "Improved pressforging of Ba$_2$YCu$_3$ZO$_x$ Superconductor", Appl. Phys. Let. 52(21) May 23, 1988, pp. 1831-1833.
Jin et al. "Processing for High Critical Currents in YBa$_2$Cu$_3$O$_{7-x}$", High Temp. Superconductors II, Apr. 1988, pp. 153-166.
Neurgaonkar et al. "Hot-Pressed Densification of High-Temp. Superconducting Ba$_2$Ln$^{3+}$Cu$_3$O$_{7-x}$ Ceramics", Mat. Res. Bull., vol. 23, pp. 143-147, 1988.

Primary Examiner—William R. Dixon, Jr.
Assistant Examiner—Chris Gallo
Attorney, Agent, or Firm—Spencer & Frank

[57] ABSTRACT

A method for producing high-temperature superconducting ceramic material through mechanical orientation including mixing starting materials in powdered form in proportions effective to produce a high-temperature superconducting oxide ceramic having anisotropic crystal grains and shaping the mixture. Next, the shaped mixture is calcined at a temperature ranging from 600° to 900° C. and fired at a temperature higher than 1,000° C. in an oxygen atmosphere for a time effective to produce a superconducting oxide ceramic having crystal grains. According to the invention, the superconductive oxide ceramic is then pulverized into particles having either a plate-like form or a needle-like form based on the anisotropic form of the crystal grains. Particles of a selected size are placed into a vessel and vibrated with an acoustic vibrator means under conditions effective to cause the pulverized particles to turn toward a common preferred orientation to provide oriented particles. Then, the oriented particles are shaped by applying pressure to the vessel in a direction perpendicular to the common preferred orientation and fired at a temperature ranging from 900° to 1,000° C. for a time effective to produce the high-temperature superconducting oxide ceramic material with anisotropic crystal structure.

4 Claims, 4 Drawing Sheets

10 μm

FIG_1A
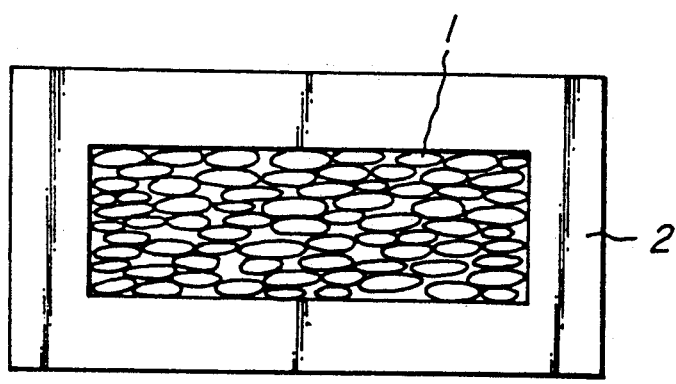
FIG_1B
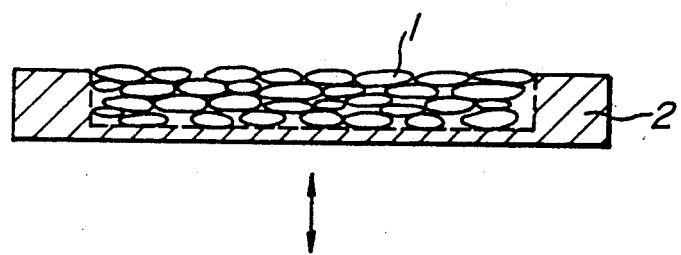

FIG._2A
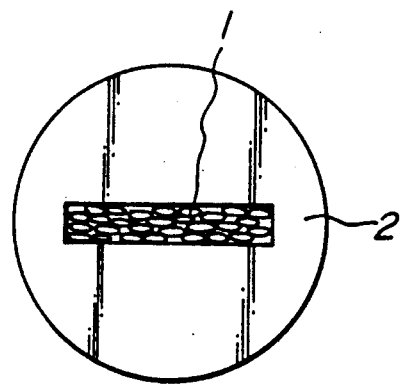
FIG._2B
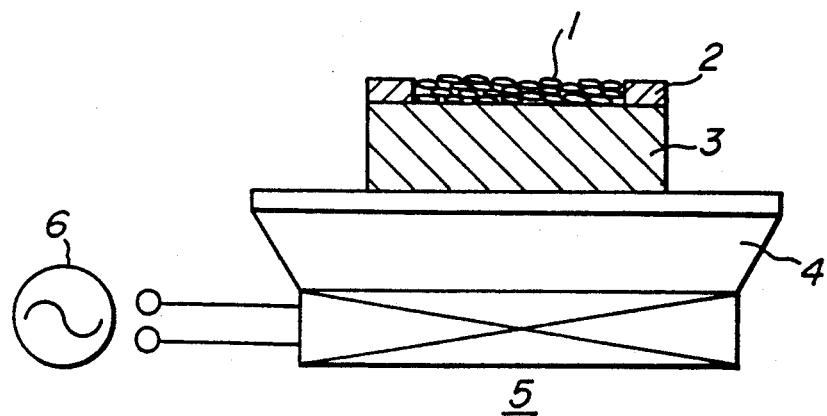

FIG_4
10 μm 5,017,548

METHOD OF PRODUCING HIGH-TEMPERATURE SUPERCONDUCTING CERAMICS MATERIAL BY MECHANICAL ORIENTATION

BACKGROUND OF THE INVENTION

1. Field of the Invention

This invention relates to a process for producing superconducting ceramics material, and more particularly to a method of producing superconducting ceramic in which a simple mechanical orientation treatment is introduced so as to improve critical current density ($J_c$) of such material to a great extent. The method of the invention is suitable for the production of superconducting products having a specific shape, such as magnets, wires, and the like.

2. Related Art Statement

When made by the regular production process, certain high-temperature superconducting oxide ceramics, for instance, $YBa_2Cu_3O_{7-x}$ type superconducting oxide ceramics, tend to have a comparatively low critical current density ($J_c$) which is at most several hundred $A/cm^2$. Such a value for the critical current density is much lower than the theoretical expected level for a single crystal, and considerable improvement is necessary before it becomes ready for practical applications. For example, in the case of wires for superconducting magnets, a critical current density ($J_c$) of 106 $A/cm^2$ or more is generally believed to be necessary.

Hence, there is a pressing need for improvement of the critical current density ($J_c$) by some way or other.

The inventors noted the fact that high-temperature superconductors tend to have crystal grains of anisotropic form, as a reflection of their crystallographic anisotropy. Thus, in order to raise the critical current density ($J_c$) of high-temperature superconducting ceramics to about the same level as that of a single crystal, it is imperative to homogenize the crystal grain size and to improve the degree of orientation. By increasing the uniformity of the grain size and the degree of orientation, junction areas between grains increase and the packing factor becomes higher. Whereby, the critical current density ($J_c$) of such high-temperature superconducting ceramics can be improved. The method of the invention uses a mechanical orientation treatment in the production of high-temperature superconducting ceramics material, which treatment includes selection of high-temperature superconducting crystal grains, mechanical vibration, and selection of boundary elements.

SUMMARY OF THE INVENTION

Therefore, an object of the present invention is to provide a mechanical orientation treatment as an essential part of a method for producing high-temperature superconducting material, which mechanical orientation results in a substantial improvement of the critical current density ($J_c$).

This object is achieved by providing a method for producing high-temperature superconducting ceramics material steps of mixing starting material powders of high-temperature superconducting oxide ceramics having anisotropic crystal grains, shaping the mixture, calcining the shaped mixture at 900° C., firing the calcined mixture at a temperature ranging from 600° to a temperature of higher than 1,000° C. in an oxygen atmosphere for a time effective to produce superconducting oxide ceramics made of large crystal grains, pulverizing the ceramics into plate-like or needle-like particles based on the anisotropic form of the crystal grains, placing pulverized particles of a selected size into a vessel, vibrating the vessel with an acoustic vibrator means under conditions effective to cause the particles to turn toward a common preferred orientation and provide oriented particles, shaping the oriented particles by pressing in a direction perpendicular to the common preferred orientation, and firing at a temperature ranging from 900° to 1,000° C. for a time effective to produce high-temperature superconducting oxide ceramics material with anisotropic crystal structure.

In the above method, the steps of pulverizing the ceramics, vibrating the selected particles, and applying pressure before the firing, constitute the mechanical orientation treatment which is a characterizing part of the invention.

More specifically, with the method of the invention, a high-temperature superconducting ceramic of good quality and with large crystal grains is grown, and the ceramic thus grown is pulverized. When being pulverized, surfaces of large crystal grains are severed successively from portion to portion depending on the weakness of bondage at each portion due to their crystallographic anisotropy. The pulverized particles are of plate-like or needle-like form. Such pulverized particles are sifted so as to classify them by grain size. The crystal grains suitable for the purpose of the invention are stuffed in a rectangular vessel with an open top. The vessel shape is not restricted to a rectangular shape. The vessel is vibrated in a vertical direction at a suitable frequency with a suitable amplitude. Due to the anisotropic form, the pulverized crystal grains are aligned or oriented substantially in a common direction as shown in FIG. 1A and FIG. 1B. Then, the aligned mass of the pulverized crystal grains are pressed and fired again. Consequently, one can obtain ceramics material with a high packing factor and a fairly high degree of orientation.

BRIEF DESCRIPTION OF THE DRAWINGS

For a better understanding of the invention, reference is made to the accompanying drawings, in which:

FIG. 1A is a schematic plan view of a rectangular vessel into which a mass of pulverized crystal grains are placed for mechanical orientation treatment therein;

FIG. 1B is a schematic sectional view of the vessel of FIG. 1A;

FIG. 2A is a schematic plan view of an acoustic vibrator which is suitable for mechanical orientation treatment in the method of the invention to produce ceramic material such as $YBa_2Cu_3O_{7-x}$ type ceramic;

FIG. 2B is a schematic sectional view of the vibrator of FIG. 2A;

FIG. 4 is a diagram showing the crystal orientation at the surface of the $YBa_2Cu_3O_{7-x}$ ceramics specimen prepared by the method of the invention, which diagram was made by using a scanning-type electronic microscope.

Throughout different views of the drawings, 1 is a pulverized superconducting particle, 2 is a rectangular vessel, 3 is a stainless steel block, 4 is a speaker (cone), 5 is an acoustic vibrator, and 6 is an AC power source.

DESCRIPTION OF THE PREFERRED EMBODIMENT

As a practical example, preparation of $YBa_2Cu_3O_{7-x}$ ceramics will be explained.

Superconducting pellets of $YBa_2Cu_3O_{7-x}$ were made from starting materials thereof through a regular sintering process, and the pellets were pulverized and reprocessed into the form of pellets again, which reprocessing included a long heating at 1,000° C. for 60 hours. Such long heat treating was employed in order to cause growth of large grains. The pellets were re-pulverized into superconducting particles 1 (FIG. 1A) of elongated needle-shape or plate-shape with a length L of 10–100 μm. The re-pulverized superconducting particles 1 were sifted by a 635 mesh screen into two groups; namely, those not shorter than 20 μm, i.e., $L \geq 20$ μm, and those shorter than 20 μm, i.e., $L < 20$ μm. The superconducting particles 1 thus sifted were separately placed in a rectangular vessel 2 made of cardboard, and the vessel 2 was placed on an acoustic vibrator 3 as shown in FIGS. 2A and 2B. The vibrator 3 applied vertical vibration to the superconducting particles 1 as shown by the arrow of FIG. 1B, so as to cause the superconducting particles 1 to turn substantially in a common preferred orientation. The thus-oriented superconducting particles 1 were pressed by applying pressure in one direction, i.e., vertically, and then heated at a temperature above 950° C. for five hours, and cooled slowly to room temperature at a rate of 0.3° C./minute. Each specimen thus formed was rectangular with dimensions of 0.2 mm (thickness), 1 mm (width) and 8 mm (length), and its critical temperature was 90° K.

The critical current density ($J_c$) of each specimen which was made by pressing the superconducting particles shorter than 20 μm with a pressure of 5 t/cm² was measured by the four-terminal method at 77° K. with a constant current, and it proved to be 520 A/cm². The specimens which were solely made of the superconducting particles not shorter than 20 μm with a similar pressing pressure were similarly tested, and their critical current density ($J_c$) was found to be at a high level of 1,500 A/cm². When specimens were made by pressing the superconducting particles not shorter than 20 μm with an increased pressure of 15 t/cm², it was revealed that the critical current density ($J_c$) was further increased to a still higher level of 4,200 A/cm² with a good reproducibility.

Figure 3A:
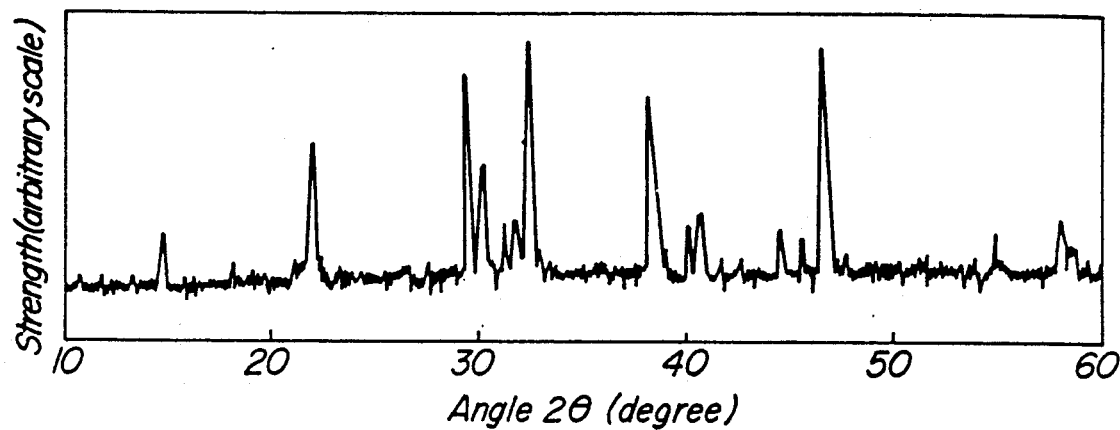
FIG. 3A is an X-ray diffraction intensity pattern diagram from surface particles of a reference specimen which was sintered at 950° C. for six hours but was not processed by the mechanical orientation treatment of the invention.
Figure 3B:
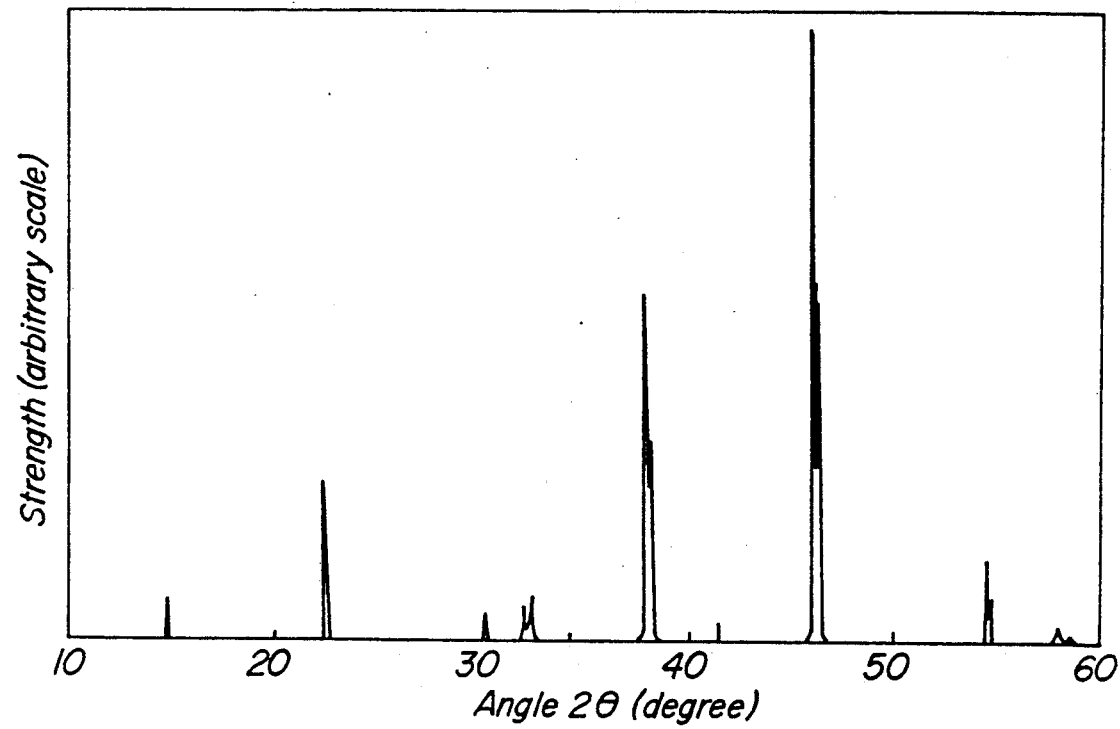
FIG. 3B is an X-ray diffraction intensity pattern diagram from surface particles of a $YBa_2Cu_3O_{7-x}$ ceramic specimen which was prepared by the method of the invention.

As a means for evaluating the crystal orientation, X-ray diffraction tests were carried out on the specimens. FIG. 3A shows the X-ray diffraction intensity pattern of a reference specimen which was made by a conventional sintering at 950° C. for six hours but without the vibration treatment for orientation. FIG. 3B shows the X-ray diffraction intensity pattern of the above-mentioned specimen of the invention which revealed the critical current density ($J_c$) of 4,200 A/cm². As can be seen from the two intensity patterns, the (0.006)/(110) peak ratio of the reference specimen was improved by 17 times by the method of the invention. Such improvement indicates that the c-axes of the crystal particles in the specimen of the invention are aligned at right angles to the surface of the specimen.

FIG. 4 shows a diagram of the crystal structure of a specimen of the invention, which diagram was prepared by using a scanning-type electronic microscope. The microscopic observation also showed that the superconducting crystal particles were well oriented in the length direction thereof. The depicted structure shows a high packing factor.

The inventors have concluded that the mechanical orientation treatment of the invention resulted in a ceramic having a high degree of crystal grain orientation and a high packing factor, and the critical density ($J_c$) was improved thereby.

As described in detail in the foregoing, when the mechanical orientation treatment of the invention is applied to the production of high-temperature superconducting ceramics, the degree of crystal orientation and the packing factor are so improved that one can obtain a high-temperature superconducting ceramic material with a high critical current density ($J_c$). The shape of the vessel for holding the superconducting particles or pellets is not restricted to the illustrated rectangle, but it can be tubular or any other suitable shape. For instance, with the method of the invention and using a tubular vessel, tubular products of high-temperature superconducting material with a high critical current density ($J_c$) can be produced. When a new high-temperature superconducting material is discovered or invented in the future, the mechanical orientation treatment of the present invention can be applied thereto provided that such new material has crystal anisotropy, and the properties of such new high-temperature superconducting material, such as degree of crystal grain orientation and packing factor and critical current density ($J_c$), can be improved.

In short, the inventors have succeeded in making a high-temperature superconducting specimen with a critical current density ($J_c$) of 4,200 A/cm² from bulk material of $YBa_2Cu_3O_{7-x}$. This value of critical current density ($J_c$) is much higher than that of conventional yttrium (Y) containing high-temperature superconducting material except materials made by the so-called melting method. The mechanical orientation treatment, preferably by means of acoustic vibration, in the method of the invention can improve the degree of grain orientation by a factor of 16 times as compared with that of the conventional non-oriented specimen. Thus, the invention has an outstanding effect and contributes greatly to the industry.

Although the invention has been described with a certain degree of particularity, it is understood that the present disclosure has been made only by way of example and that numerous changes in details may be resorted to without departing from the scope of the invention as hereinafter claimed.

What is claimed is:

1. A method for producing high-temperature superconducting ceramic material through mechanical orientation, the method comprising the steps of:
    a. mixing starting materials in powdered form and in proportions effective to produce a mixture for a high-temperature superconducting oxide ceramic having anisotropic crystal grains;
    b. shaping the mixture to provide a shaped mixture;
    c. calcining the shaped mixture at a temperature ranging from 600° to 900° C. to provide a calcined mixture;

d. firing the calcined mixture at a temperature higher than 1,000° C. in an oxygen atmosphere for a time effective to produce a superconducting oxide ceramic having crystal grains, and cooling the superconducting oxide ceramic;

e. pulverizing the superconductive oxide ceramic of step d with means effective to pulverize same into particles having one of a plate-like form and a needle-like form based on the anisotropic form of the crystal grains to provide pulverized particles;

f. placing pulverized particles of a selected size into a vessel;

g. vibrating the vessel with an acoustic vibrator means under conditions effective to cause the pulverized particles placed therein to turn toward a common preferred orientation to provide oriented particles;

h. shaping the oriented particles by applying pressure to the vessel in a direction perpendicular to the common preferred orientation; and i. firing the shape and oriented particles at a temperature ranging from 900° to 1,000° C. for a time effective to produce a high-temperature superconducting oxide ceramic material with anisotropic crystal structure.

2. The method according to claim 1, wherein the superconducting oxide ceramic material has a general chemical formula $YBa_2Cu_3O_{7-x}$, wherein x is a positive number not larger than 0.2 ($0 < x \leq 0.2$).

3. The method according to claim 1, wherein calcining in step (c) and firing in step (i) are performed in an oxygen atmosphere.

4. A method for producing a high-temperature superconducting $YBa_2Cu_3O_{7-x}$ ceramic through mechanical orientation, the method comprising the steps of:

a. mixing starting materials in powdered form and in proportions effective to produce a mixture for a high-temperature superconducting oxide ceramic consisting of $YBa_2Cu_3O_{7-x}$ and having anisotropic crystal grains;

b. shaping the mixture to provide a shaped mixture;

c. calcining the shaped mixture at a temperature ranging from 600° to 900° C. in an oxygen atmosphere to provide a calcined mixture;

d. firing the calcined mixture at a temperature higher than 1,000° C. in an oxygen atmosphere for a time effective to produce a superconducting oxide ceramic having crystal grains, and cooling the superconducting oxide ceramic;

e. pulverizing the superconductive oxide ceramic of step d with means effective to pulverize same into particles having one of the plate-like form and a needle-like form based on the anisotropic form of the crystal grains to provide pulverized particles;

f. placing pulverized particles of a selected size into a vessel;

g. vibrating the vessel with an acoustic vibrator means under conditions effective to cause the pulverized particles placed therein to turn toward a common preferred orientation to provide oriented particles;

h. shaping the oriented particles by applying pressure to the vessel in a direction perpendicular to the common preferred orientation; and i. firing the shape and oriented particles at a temperature ranging from 900° to 1,000° C. in an oxygen atmosphere for a time effective to produce a high-temperature, superconducting oxide ceramic material with anisotropic crystal structure.

* * * * *